United States Patent [19]

Weiswurm

[11] Patent Number: 4,941,516

[45] Date of Patent: Jul. 17, 1990

[54] METHOD AND APPARATUS FOR STRAIGHTENING THE PINS OF A PIN GRID ARRAY

[76] Inventor: Klaus D. Weiswurm, 818 E. Myrtle St., San Antonio, Tex. 78212

[21] Appl. No.: 260,602

[22] Filed: Oct. 20, 1988

[51] Int. Cl.$^5$ .............................................. B21F 1/02
[52] U.S. Cl. .................................................. 140/147
[58] Field of Search .............................. 140/140, 147

[56] References Cited

U.S. PATENT DOCUMENTS

| | | | |
|---|---|---|---|
| 3,225,797 | 12/1965 | Stoody | 140/147 |
| 3,344,816 | 10/1967 | Zemek | 140/147 |
| 3,520,336 | 7/1970 | Zemek | 140/147 |
| 3,525,372 | 8/1970 | Haven | 140/147 |
| 3,687,172 | 8/1972 | Suverkropp | 140/147 |
| 3,857,420 | 12/1974 | Newman | 140/140 |
| 4,094,410 | 6/1978 | Fegley et al. | 140/147 |
| 4,643,234 | 2/1987 | Alemanni | 140/147 |
| 4,691,747 | 9/1987 | Sokolovsky | 140/147 |
| 4,789,011 | 12/1988 | Moloney | 140/147 |

OTHER PUBLICATIONS 2,187,123 A, U.K. Patent Application; pub. Sep. 3, 1987, inventor–Othmar Horat (4 sheet drwg and 4 page spec.).

IBM Technical Disclosure Bulletin, vol. 22, No. 3, Aug. 1979, pp. 1102, "Precision Pin Straightening Comb" by Cioffi, Jr. et al.

*Primary Examiner*—E. Michael Combs
*Attorney, Agent, or Firm*—Cox & Smith Incorporated

[57] ABSTRACT

Method and apparatus for straightening the pins of a computer chip, logic or integrated circuit, or other type of semiconductor device having a pin grid array (16). The apparatus includes a rotating turret (28) for positioning the pin grid array (16) at a plurality of stations (20) and (22) for performing a series of straightening operations to the pins (18) at each station, first and second rakes (110) and (110$^2$), each of the rakes (110 and 110$^2$) having a plurality of tines (112) extending therefrom for insertion between the pins (18) of the pin grid array (16) in first and second directions, a jig (136) having a plurality of holes (146) therein for receiving the pins (18) when the jig (136) is moved toward the wafer (40) of the pin grid array (16) to straigthen the pins (18), and appropriate controls for advancing the pin grid array (16) positioned in the turret (28) from one station to another and controlling the insertion of the tines (112) of the first and second rakes (110) and (110$^2$), the raising and lowering of the rakes (110) and (110$^2$) and the jig (136), and activating the mechanisms for loading and unloading the pin grid array (16) into the turret (28). The method includes the steps of raking the pins (18) of the pin grid array (16) in a first direction, raking the pins (18) in a second direction, and then finely straightening the pins (18) by moving a jig (136) having a plurality of holes (146) therein for receiving the pins (18) toward the wafer (40).

21 Claims, 8 Drawing Sheets

METHOD AND APPARATUS FOR STRAIGHTENING THE PINS OF A PIN GRID ARRAY

BACKGROUND OF THE INVENTION

The present invention relates to a method and apparatus for straightening the pins of a semiconductor or computer chip, integrated circuit or logic circuit. More particularly, the present invention relates to a method and apparatus by which the quality of large numbers of such pin grid arrays is quickly and conveniently improved.

Computer chips, logic circuits, microprocessor chips, integrated circuits, and other semiconductor devices generally include an array of nominally parallel metal pins extending from at least one side thereof. All such devices shall be referred to herein as pin grid arrays. Although there may be different numbers of pins on different types of pin grid arrays, and the pins may be of different lengths or arrangement, the pins are generally arrayed in rows and columns and project from the wafer of the pin grid array at a right angle with respect thereto.

Complex pin grid arrays, as well as those intended for critical operations, are often quite expensive such that quality control is an extremely important part of their production, and a frequent quality control problem is the bending or, in extreme cases, breaking, of those metal pins. The problem is an almost inevitable result of the handling of the pin grid array during production, packaging and shipping, and is particularly acute when the pins are constructed of highly conductive metals, such as gold. Especially when the pin grid array is to be assembled by robotic or other automatic manufacturing method, a pin grid array without parallel pins, i.e., pins which project from the wafer at a right angle, is likely to be considered a reject, especially when, so far as is known, there is no convenient, rapid and readily available method or apparatus available for straightening the bent pins. It is, therefore, an object of the present invention to provide such a method and apparatus.

Even when being incorporated into an electrically or electronically operated device for which final assembly is accomplished manually such that the pin grid array can be inspected visually or tested before assembly, any bent pins are generally straightened manually. Manual straightening of the pins is accomplished either with fingertips, which has the almost inevitable result of slightly bending some previously straight pins even though the one or more bent pins may be significantly straighter, or with a pair of small pliers or similar implement. In the latter case, the implement often scratches the pins, which is problematical when the pins are plated, e.g., gold plated on copper or other, less conductive, metal. In the case of pins which are solid gold, using such an implement can result in the breaking of a badly bent pin. Further, manual handling of the pin grid array also increases the opportunity for the array to be dropped or bumped against another object. The ceramic wafer of the array is itself quite fragile and particularly susceptible to the formation of microscopic cracks which affect the functioning of the circuitry therein. It is, therefore, another object of the present invention to provide an apparatus for straightening the pins of a pin grid array that does not damage the pins.

It is another object of the present invention to provide an apparatus for straightening the pins of a pin grid array which is capable of straightening the pins of arrays of different dimensions, number of pins, pin diameters, and pin lengths.

It is another object of the present invention to provide an apparatus and method for straightening the pins of a pin grid array which does not involve manual handling of the pin grid array.

Still another object of the present invention is to provide an apparatus and method by which a pin grid array can be received directly from a production line or other assembly process and, after having the pins straightened, loaded into a shipping tube or other container.

It is a further object of the present invention to reduce the number of defective pin grid arrays having defects as a result of the bending of the pins thereof.

These, and other objects, features and advantages of the present invention will be apparent to those skilled in the art from the following description of a presently preferred embodiment of an apparatus constructed in accordance therewith.

SUMMARY OF THE INVENTION

These objects are accomplished by providing an apparatus for straightening the pins of a pin grid array having a plurality of nominally parallel pins extending from the wafer thereof at a plurality of stations for performing a series of pin straightening operations and means for loading the pin grid array into the positioning means. Means is provided having a plurality of elongate members extending therefrom for insertion between the pins of the pin grid array in first and second directions when the pin grid array is positioned at one of the stations for combing the pins when the elongate members are moved away from the wafer of the pin grid array. Means having a plurality of holes therein for receiving the pins of a combed pin grid array when the combed pin grid array is positioned at another of the stations and the pin receiving means is moved toward the wafer thereof, each of the holes having a funnel-shaped profile for fine straightening of a pin received therein. Finally, means is provided for unloading a pin grid array having straightened pins extending therefrom from the positioning means.

These objects are also accomplished by providing a method of straightening the pins of a pin grid array comprising inserting the tines of a first rake between the rows of pins of a pin grid array and combing away from the wafer of the pin grid array to straighten the pins in a first direction and then inserting the tines of a second rake between the columns of pins and combing with the second rake away from the wafer of the pin grid array to straighten the pins in a second direction. A jig having a plurality of holes therein is then moved toward the wafer of the pin grid array, each of the holes having a funnel-shaped profile, for fine straightening of a pin received therein. The pin grid array, having straightened pins extending from the wafer thereof, is then loaded into a shipping tube, storage container or rack, or the loading chute of a device for subsequent assembly of the pin grid array into a device including that pin grid array.

DETAILED DESCRIPTION OF PREFERRED EMBODIMENT

Figure 1:
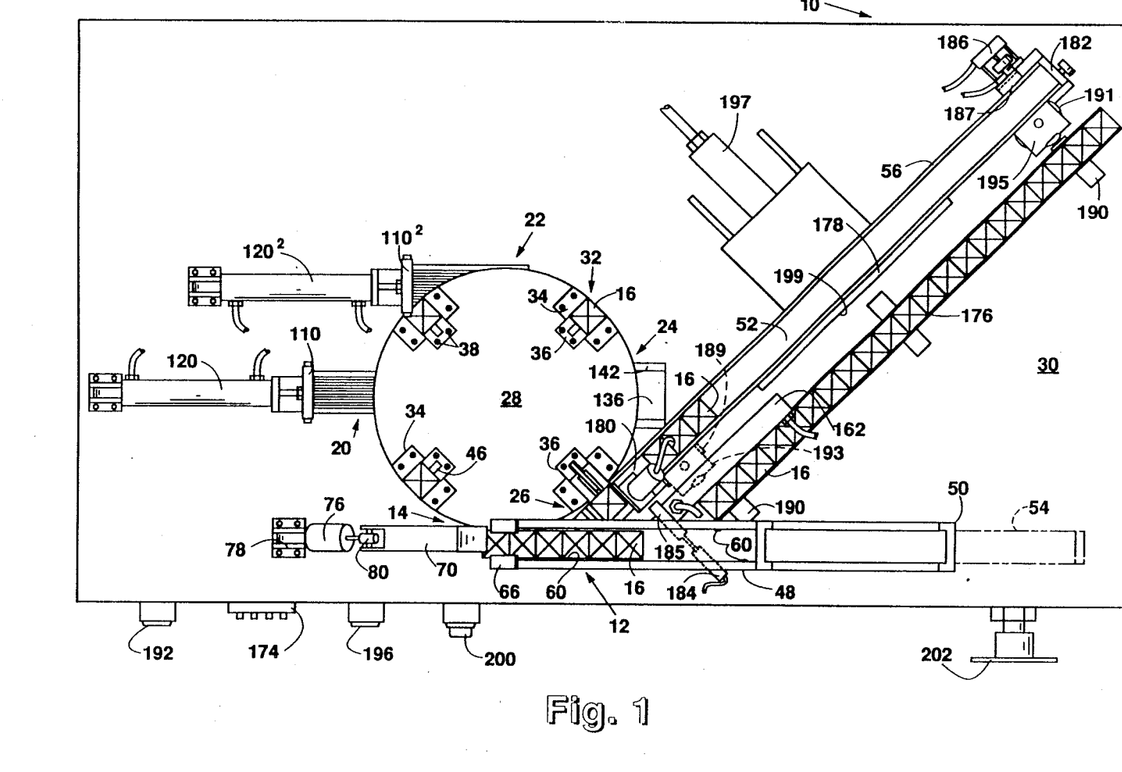
FIG. 1 is a top plan view of an apparatus for straightening the pins of a pin grid array constructed in accordance with the present invention.

A presently preferred embodiment of an apparatus for straightening the pins of a pin grid array is comprised of several component parts, all of which are visible in FIG. 1. The apparatus, indicated generally at reference numeral 10, includes a positioning means 12, means 14 for loading a pin grid array 16 into positioning means 12, means for insertion between the pins 18 (see FIGS. 5 and 6) of pin grid array 16 in first 20 and second 22 directions for combing the pins 18, means 24 for receiving the pins 18 of a combed pin grid array 16 therein for fine straightening of the pins 18, and means 26 for unloading the pin grid array 16 having straightened pins 18 extending therefrom from the positioning means 12. Referring to each of the several components in more detail, positioning means 12 is comprised of a turret 28 rotatably mounted in a bearing 29 (see FIG. 7A) to table 30 (see FIGS. 3A, B, and C). Turret 28 is provided with a plurality of jigs 32 for retaining a pin grid array 16 therein, each of the jigs 32 being formed by a pair of lateral dies 34 and a back die 36 releasably mounted to turret 28 with nuts 38. To insure proper alignment of lateral dies 34 and back die 36 with, for instance, loading means 14, on turret 28, the threaded studs 39 onto which nuts 38 are screwed to secure lateral dies 34 and back dies 36 to turret 28 serve as dowels or pins which are sized so as to be received within the holes (not numbered) in lateral dies 34 and back dies 36 on very close tolerances. Jig 32 is shown in more detail in FIGS. 6–9, in which it can be seen that the wafer 40 of pin grid array 16 is received in the slots 42 of the lateral dies 34 and, when inserted into jig 32 as will be described, abuts the surface 44 of back die 36. The surface 44 of back die 36 is provided with a recess 46 for a purpose which will be made clear below.

Lateral dies 34 and back die 36 are releasably mounted to turret 28 as described above to allow dies of different sizes to be substituted therefore to accommodate pin grid arrays of different dimensions within jigs 32. However, in a presently preferred embodiment of the invention, the means 12 for positioning a pin grid array 16 at a plurality of stations for performing an operation at each station takes the form of a turret (not shown) having jigs 32 of fixed size integrally formed in the turret itself for positioning a pin grid array 16. The table 30 is provided with a quick release (not shown) for the bearing 29 described above which allows quick and convenient switching of a turret 28 having jigs 32 formed therein of one size for another turret 28 having jigs 32 formed therein of a second size for accommodating a pin grid array 16 having different dimensions.

Loading means 14 is comprised of a chute 48 positioned at an angle with respect to turret 28 and with respect to the horizontal (see FIG. 2) having a guide 50 mounted thereto for aligning a container 52 with chute 48 for causing a pin grid array 16 contained therein to slide out of container 52 into chute 48 under the influence of gravity. Container 52 is of a type commonly used for shipping and/or storing quantities of pin grid arrays 16 and generally referred to as a "tube," and as shown in the drawings, the pin grid arrays 16 are unloaded from a first tube 54 into turret 28 and out of turret 28 into a second tube 56. It will, however, be understood by those skilled in the art who have the benefit of this disclosure that loading means 14 could take the form of a conveyor as discussed below or the unloading chute of another device, for example, a manufacturing device such as an oven for baking the ceramic wafer 40 of pin grid array 16, or that first tube 54 could be any other type of rack or container for storing or transporting pin grid arrays 16.

Not only are the pins 18 of a pin grid array 16 relatively fragile, but as noted above, so are the wafers 40. Consequently, chute 48 is provided with means for retarding the descent of a pin grid array 16 downwardly therethrough. As shown in shadow lines at reference numeral 54 in FIGS. 1 and 2, when a first tube 54 is placed in guide 50 and then tipped in the direction of arrow 58, a pin grid array 16 contained therein slides downwardly into chute 48, the descent retarding means taking the form of rollers 60 which engage the edges of the wafer 40, thereby preventing damage to the wafer 40 when pin grid array 16 reaches the bottom of chute 48 or contacts another pin grid array 16 already positioned in chute 48.

To properly retard the descent of a pin grid array 16 down chute 48, the rollers 60 must be positioned so as to engage the wafer 40 of each pin grid array 16, and with pin grid arrays of different dimensions, such engagement becomes problematical. To insure such contact, rollers 60 can be mounted on spring-loaded arms (not shown) which are pivotally mounted in the walls of chute 48, or chute 48 can be replaced with a chute 48 having a different cross-sectional dimension and fixed rollers 60 in the walls thereof. To facilitate convenient replacement of chute 48, in a presently preferred embodiment, chute 48 is releasably secured to an inclined platform 62 by a quick release screw, shown in shadow lines at reference numeral 63 in FIG. 2, which extends downwardly through a hole (not numbered) through platform 62 and which is held in place by a knob 64 having threads formed therein for receiving screw 63. Dowels, shown in shadow lines in FIG. 2 at reference numeral 65, are spaced along platform 62 and are received within holes (not numbered) in the bottom of chute 48 to insure accurate alignment of different size chutes 48 on platform 62. Platform 62 is also provided with a pair of flanges 66 (FIG. 3B), releasably mounted with screws 68, which can be adjusted or replaced with flanges of different sizes to insure proper positioning of chute 48, as well as a pin grid array 16 positioned therebetween, for loading into positioning means 12.

Figure 3A:
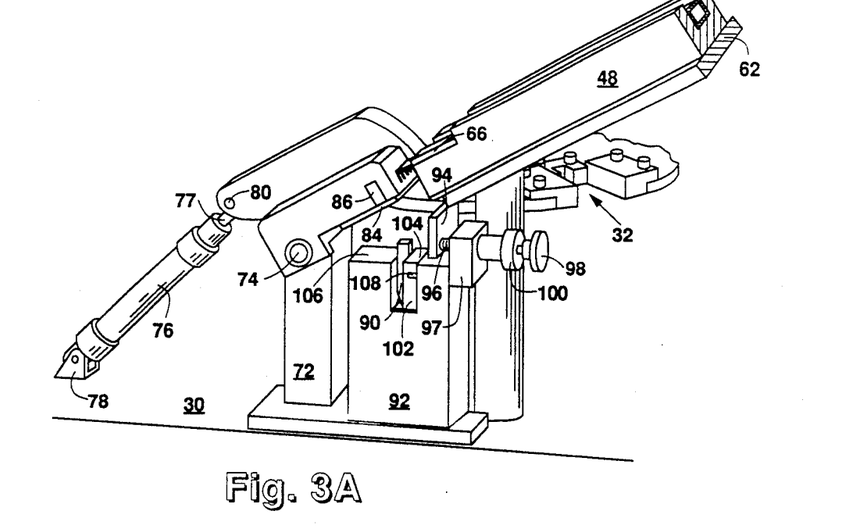
FIGS. 3A–3C are enlarged, perspective views of a portion of the apparatus of FIG. 1 showing the transfer head of that apparatus.
Figures 3B, 3C:
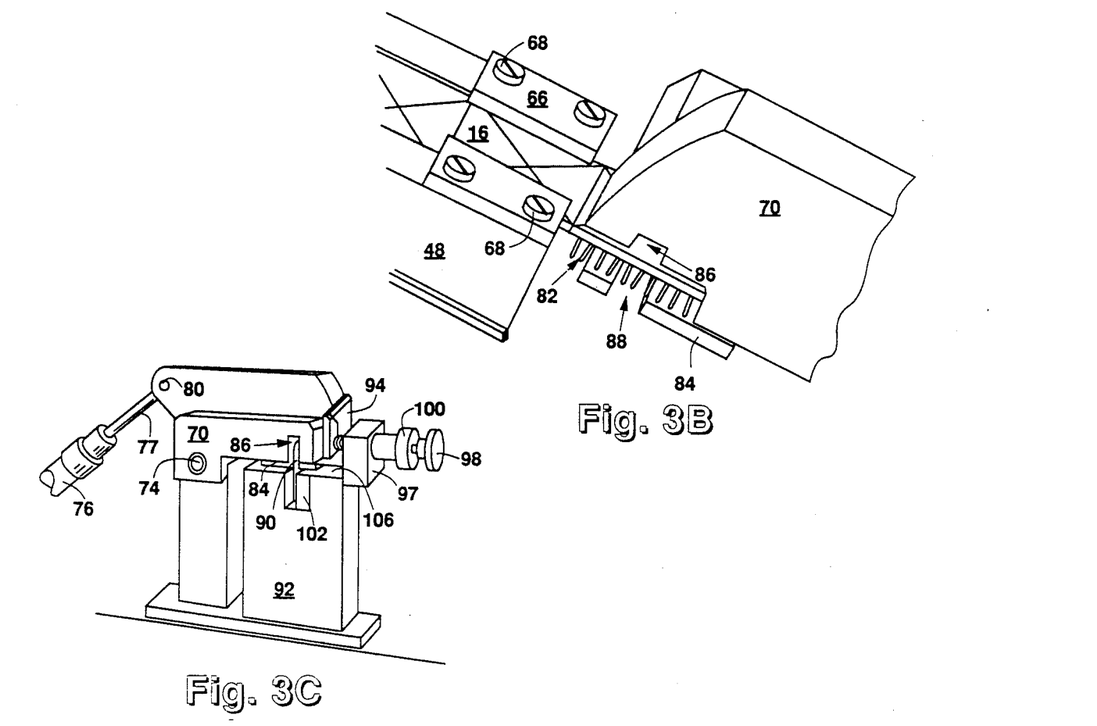

Loading means 14 is also comprised of a pivoting transfer head 70, shown in detail in FIGS. 3A-C. Transfer head 70 receives a pin grid array 16 from chute 48 at an angle with respect to positioning means 12, as well as the horizontal, and stages the pin grid array for loading into positioning means 12. Transfer head 70 is pivotally mounted to pedestal 72 which is integral with table 30 on axle 74 and pivots under the influence of a pneumatic cylinder 76 which is pivotally mounted to table 30 at one end on ears 78 and to the pin 80 of transfer head 70 at the other end. A recess 82 is formed in one end of transfer head 70 for receiving a pin grid array 16 from between the flanges 66 of chute 48, the bottom of recess 82 being closed by a plate 84 to prevent the pin grid array 16 contained therein from falling out. The recess 82 is provided with a slot 86, and plate 84 is provided with a similar slot 88 for receiving the top of a kicker arm 90 when transfer head 70 is pivoted to stage the pin grid array 16 contained within recess 82 as shown in FIG. 3C.

Kicker arm 90 projects upwardly from the axle (not shown) on which one end thereof is mounted, the axle being journaled in a pedestal 92, and the ram (not shown) of a double acting pneumatic cylinder (which cannot be seen in the figures because pedestal 92 blocks the line of vision) is pivotally mounted to kicker arm 90 at a point above the axle to cause kicker arm 90 to move back and forth through the slots 86 and 88 in transfer head 70 and plate 84, respectively. In that manner, when transfer head 70 pivots downwardly from the position shown in FIGS. 3A and 3B to stage a pin grid array 16 as shown in FIG. 3C, kicker arm 90 engages the wafer 40 of pin grid array 16 upon activation of the pneumatic cylinder to push, or kick, the staged pin grid array 16 into one of the jigs 32 in turret 28.

A plate 94 mounted on the end of screw 96 is held in position by threading screw 96 through an unthreaded hole in the block 97 mounted to pedestal 92, the knob 98 on the other end of screw 96 being provided to facilitate positioning of plate 94 as a fence for engaging the wafer 40 of a pin grid array 16 being kicked into turret 28 by kicker arm 90, thereby insuring alignment of wafer 40 with the slots 42 in the lateral dies 34 of jigs 32.

As noted above, one of the objects of the present invention is to provide an apparatus which is capable of being used with pin grid arrays of different dimensions and pin lengths. The plate 94 mounted on screw 96 provides such flexibility in that screw 96 is advanced into or out of lock nut 100 to position plate 94 in accordance with the dimension of the particular pin grid array on which the series of straightening operations is to be performed. Lock nut 100 is provided to insure that screw 96 does not move during straightening operations on a series of pin grid arrays, and a spring (not shown) is provided within lock nut 100 to allow plate 94, screw 96, and lock nut 100 to be moved as a unit relative to block 97 to facilitate access to kicker arm 90 and the block 102 described below.

To insure that the wafer 40 of a staged pin grid array 16 in the recess 82 in transfer head 70 is vertically aligned with the slots 42 in the lateral dies 34 of jigs 32 regardless of the length of the pins 18 thereof, a rectangular block 102 is pivotally mounted to pedestal 92. Block 102 is spring-mounted to pedestal 92 at a position which is slightly off-center relative to block 102 and the top surface 104 of block 102 engages the bottom surface of plate 84 when transfer head 70 pivots downwardly. Mounting the rectangular block 102 in off center fashion to pedestal 92 provides different heights for the top surface 104 of block 102 relative to the top surface 106 of pedestal 92, the lowest of which is lower than the top surface 106 of pedestal 92 so that the top surface 106 of pedestal 92 becomes the surface which is engaged by the bottom surface of plate 84 when transfer head 70 pivots downwardly.

A pin 108, shown in shadow lines in FIG. 3A, projects from pedestal 92 into one of four recesses (not numbered) in the surface of rectangular block 102 opposite the surface adjacent kicker arm 90 to insure alignment of the top surface 104 of block 102 with the horizontal. To rotate block 102 from one position to another, plate 94 is moved away from block 102 by pulling on knob 98 against the spring in locknut 100, kicker arm 90 is manually pivoted, against the resistance of the pneumatic cylinder that is mounted thereto, toward turret 28 to provide the necessary clearance, and block 102 is pulled clear of pin 108 into the space vacated by kicker arm 90 and then rotated ninety degrees until the pin 108 can be positioned in another of the recesses formed in block 102. As noted above, block 102 is spring-mounted to pedestal 92, such that, when block 102 is pulled into the space vacated by kicker arm 90, the resistance of the spring must be overcome, the result being that block 102 is always held securely against pedestal 92.

Additional adjustability for pin grid arrays 16 having pins 18 of different lengths is provided by the flanges 66 on chute 48 and the plate 84. Depending on the vertical dimension of the pins 18 of the pin grid array 16, flanges 66 and plate 84 can be changed out for parts of different thicknesses, the plate 84 being releasably mounted to transfer head 70 by flat head screws (not shown). Plate 84 and the top surface 104 or 106 of block 102 or pedestal 92, as the case may be, cooperate to limit the extent of travel of the ram 77 of pneumatic cylinder 76 and, consequently, the angle through which transfer head 70 pivots, while avoiding any contact between the pins 18 and the surfaces 102 and 104, thereby preventing damage to the pin grid array 16 during staging operations.

Transfer head 70, chute 48, and the associated structure described above is but one embodiment of loading means 14. Those who are skilled in the art who have the benefit of this disclosure will recognize that all that is required is that means be provided for loading a pin grid array 16 into turret 28. For instance, in a presently preferred alternative embodiment (not shown) loading means 14 takes the form of a pick and place unit which picks the pin grid array 16 up out of a chute such as the chute 48 which runs past turret 28 and moves the picked pin grid array 16 horizontally into the jig 32, all under pneumatic power. Such structure can be combined with a test station and a gate (also not shown) to test each pin grid array 16 and, if a Pin grid array 16 is unable to pass the test, the gate kicks that pin grid array 16 into a chute such as the chute 48 using a kicker arm similar in structure and operation to the kicker arm 90. Unlike the chute 48, however, the chute is preferably only slightly inclined, movement therealong being accomplished by high frequency vibration. An infrared proximity sensor is used to activate the pick and place unit so that once the rejected pin grid array 16 reaches the pick and place unit, the rejected pin grid array 16 is already staged such that, unlike transfer head 70, no pivoting is necessary to position the pin grid array 16 so that loading into jig 32 can be accomplished. The series of straightening operations is then performed and unloading means 26, instead of unloading the pin grid array 16 having straightened pins 18 extending therefrom into a second tube 56 as described below, unloads the pin grid array 16 back into the test station, where the test is repeated and, if necessary, the entire straightening process repeated until the rejected pin grid array 16 tests out.

Once a pin grid array 16 has been positioned in jig 32, the turret 28 is rotated to advance that pin grid array 16 to the first combing station 20. Turret 28 is preferably advanced by an eighth of a revolution at a time such that pin grid array 16 is positioned at either 45 or 90 degree reference points when turret 28 stops, and first combing station 20 is preferably positioned on table 30 at a position which is one fourth of a revolution from transfer head 70 so that turret 28 is advanced twice to register grid array 16 with first combing station 20. Because the pin grid array 16 advances by a 45° rotation and then stops at a station at which an operation is performed, turret 28 is said to index, e.g., to progressively position pin grid array 16 at a plurality of stations at which an operation is performed.

First combing station 20 comprises means having a plurality of elongate members extending therefrom for insertion between the pins 18 of the pin grid array 16 for combing the pins 18 in a first direction in the form of a rake 110 having a plurality of tines 112 extending therefrom. Rake 110 is mounted by screws 113 to a carriage 114 which slides back and forth in the guides 116 formed in tracks 117, the screws 118 being journaled in guides 116, under the influence of double acting pneumatic cylinder 120, the other end of pneumatic cylinder 120 being pivotally mounted on axle 122 of mount 124 to table 30. The tracks 117 on which carriage 114 slide are pivotally mounted to an axle 126 journaled therein, axle 126 being journaled to the ram 128 of a second double acting pneumatic cylinder 130 mounted to table 30 for raising and lowering rake 110.

Figure 5:
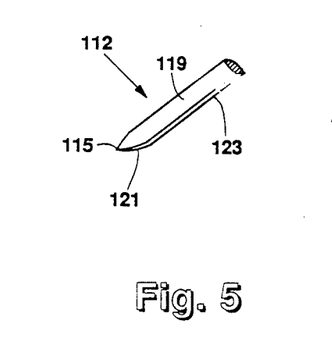
FIG. 5 is an enlarged, perspective view of the end of one of the tines of the rakes of one of the combing stations of the apparatus of FIG. 1.

It will be understood by those skilled in the art who have the benefit of this disclosure that rake 110 may be removed from carriage 114 by screws 113 so that a rake (not shown) having different arrangements of the tines 112 thereof for combing the pins of pin grid arrays of different dimensions can be substituted. It is also common for a pin grid array to be provided with spacers, insulators, or other structure on the bottom surface of wafer 40 such that one or more of the tines 112 of rake 110 must be positioned lower on the rake than the other tines 112, and such rakes are also capable of being substituted onto carriage 114 so that it can be said that a rake 110 is selected having an arrangement of tines 112 which allows the tines 112 to be inserted between the nominally parallel pins 18 of the rows of pins 18 of a pin grid array 16. Regardless of their arrangement on rake 110, the tines 112 of rake 110 are shaped to facilitate their insertion between two nominally parallel pins 18 and to straighten the pins 18 without damaging them as shown in FIG. 5. In particular, the end 115 of each tine 112 is pointed to facilitate insertion of the tine 112 between two nominally parallel pins 18. Further, because two nominally parallel pins 18 are spaced apart at their base, e.g., at wafer 40, but may be very close together at their ends if bent towards each other, the top 119 of each tine 112 is broader than the bottom of tine 112 such that the bottom of each tine 112 forms a keel 121. In much the same way that the prow and keel of a boat cooperate to Part water to facilitate the passage of the boat, the point at the end 115 and the keel 121 of tine 112 cooperate to facilitate passage of tine 112 between and then down through the rows of pins 18. Keel 121, and the gradually sloping side surfaces 123 of each tine 112, also decrease the likelihood of damage to the pins 18 as they are straightened by the downward movement, or combing, of the tine 112 that has been inserted therebetween. The sloped surfaces 123 straighten the pins 18 gradually as the pins 18 slide across them, the keel 121 again acting as a leading edge to accomplish the initial separation of adjacent pins 18.

Figure 4:
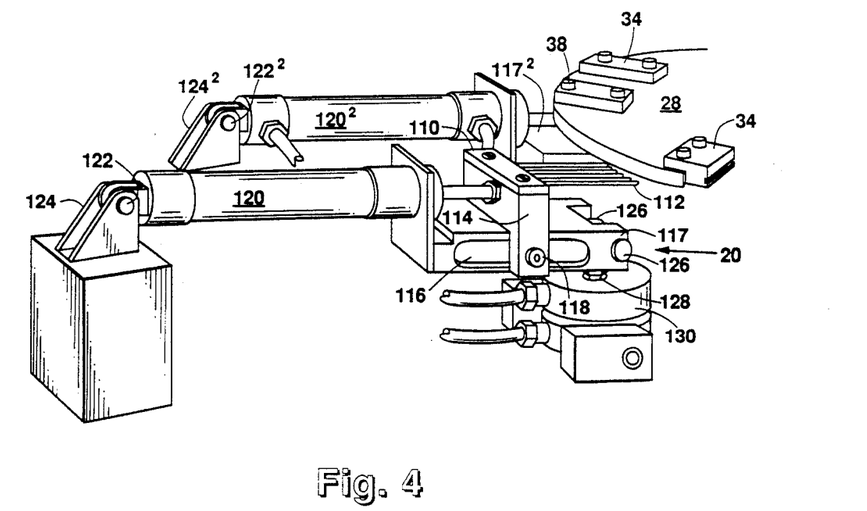
FIG. 4 is an enlarged, perspective view of a portion of FIG. 1 showing the first combing station thereof.
Figure 6A:
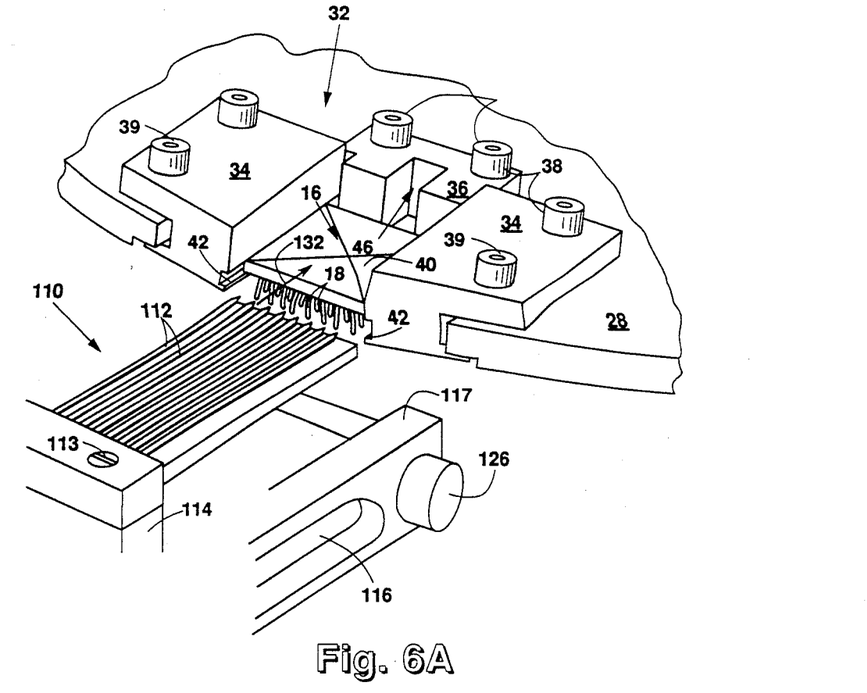
FIGS. 6A–6B are enlarged, perspective views of the first raking station of FIG. 4.
Figure 6B:
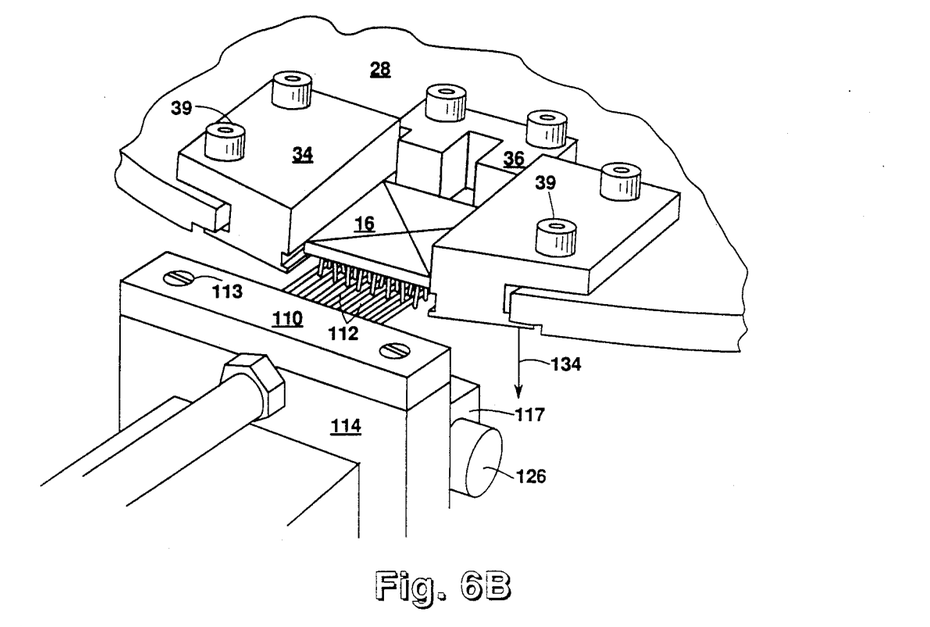

As shown in FIGS. 4, 6A and 6B, first combing station 20 is mounted to table 30 in a position located at one of the 45 degree reference points from loading means 14 and oriented so that the axis of pneumatic cylinder 120 is coincident with a radius of turret 28 so that, when a pin grid array 16 is indexed to the 45 degree reference point at which the jig 32 positioning that pin grid array 16 is also coincident with the radius with which pneumatic cylinder 120 is coincident (FIG. 5A). Once the pin grid array is positioned at that station, pneumatic cylinder 120 is activated to extend the rake 110 mounted thereto so that the tines 112 thereof are inserted between the rows of pins 18 in close proximity to the wafer 40 of that pin grid array 16, e.g., in the direction of arrow 132, to the position shown in FIG. 5B. Pneumatic cylinder 130 is then activated to pull track 117, carrying carriage 114 and rake 110 therewith, downwardly, e.g., in the direction of arrow 134 in FIG. 5B. The movement of the tines 112 of rake 110 away from the wafer 40 of pin grid array 16 as described above combs the pins 18 in a first direction, thereby providing the first of the series of straightening operations performed at the stations to which the pin grid array 16 is indexed. Downward movement of rake 110 also lowers the tines 112 to the point at which turret 28 can be advanced without the danger of engaging tines 112 with the pins 18 of a second pin grid array 16 or a portion of turret 28.

Although reference has been made to the insertion of the tines 112 between the rows of nominally parallel pins 18 extending from one side of a pin grid array to straighten those pins 18 in a first direction, assignment of the designation "rows" is arbitrary; the tines 112 could also be considered to have been inserted between the columns of pins 18. It will be understood by those skilled in the art who have the benefit of this disclosure that, by so stating, it is not intended that the straightening operations must be performed in any particular sequence or order except that, after the pins 18 are straightened in a first direction, they are also straightened in a second direction.

Figures 7A, 7B, 7C:
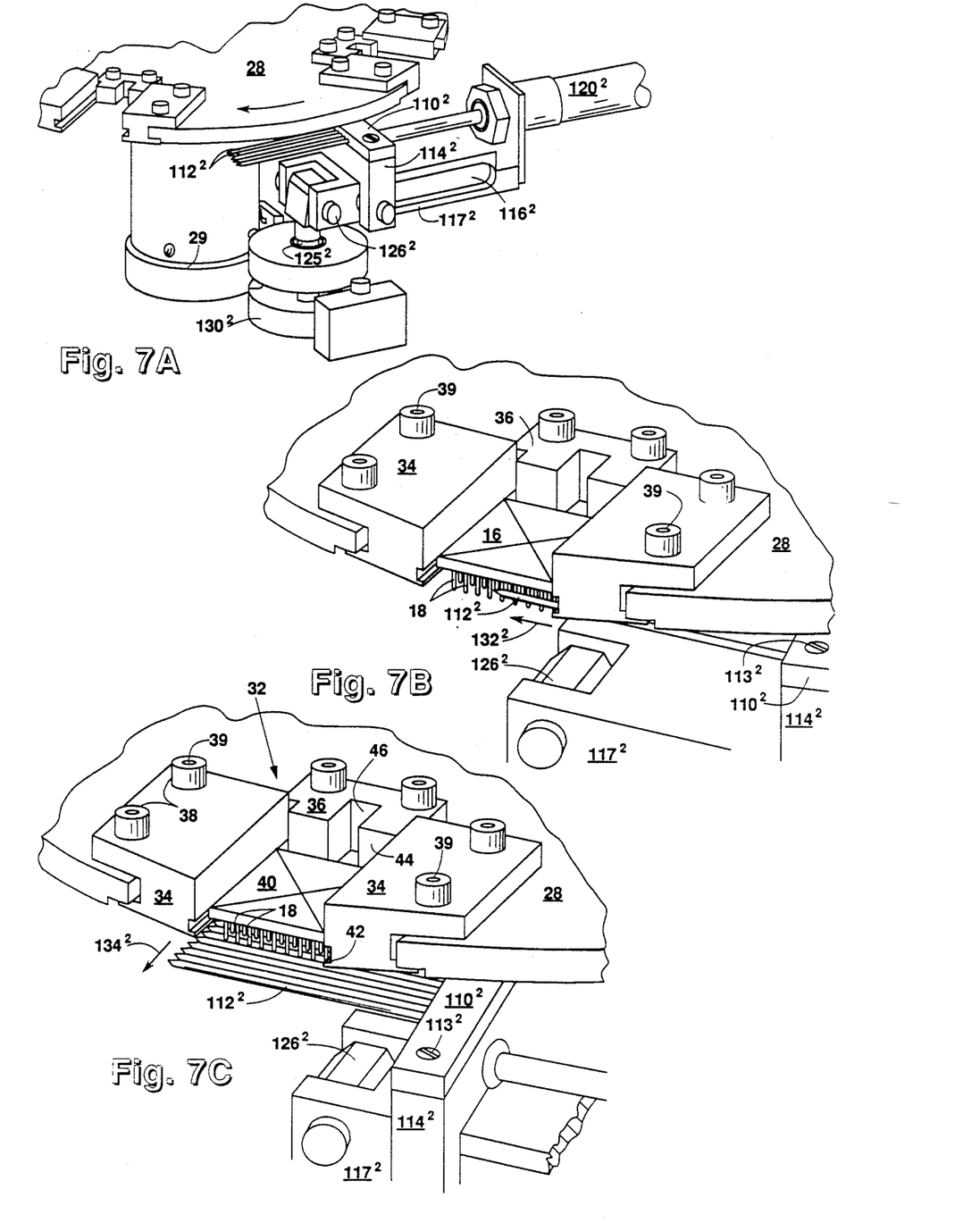
FIGS. 7A–7C are enlarged, perspective views of the apparatus of FIG. 1 showing the second combing station thereof.

The straightening in the second direction is accomplished at a second combing station 22, shown in detail in FIGS. 7A-7C. Insofar as all of the component parts of second combing station 22 are the same as those of first combing station 20, that structure will not be described a second time. Instead, the parts of second combing station 22 are numbered with the same reference numerals as those of first combing station 20 with the superscript "2" being used to designate the structure as part of second combing station 22.

To provide for the straightening of the pins 18 of pin grid array 16 in the second direction, the axis of the pneumatic cylinder $120^2$ is mounted to be coincident with a tangent taken from turret 28 at a point which is half a revolution (at a ninety degree reference point)

from the point at which a pin grid array 16 is loaded in the turret 28, e.g., loading means 14. Mounting the rake $110^2$ in this manner results in the insertion of the tines $112^2$ of rake $110^2$ between the columns of pins 18 in close proximity to the wafer 40 of the pin grid array 16, e.g., in the direction of arrow $132^2$ in FIG. 7B to the position shown in FIG. 7C. Pneumatic cylinder $130^2$ is then activated to pull track $117^2$, carrying carriage $114^2$ and rake $110^2$ therewith, downwardly, e.g., in the direction of arrow $134^2$ in FIG. 7C. The movement of the tines $112^2$ of rake $110^2$ away from the wafer 40 of pin grid array 16 combs pins 18 in a second direction, thereby providing the second of the series of straightening operations performed at the stations to which pin grid array 16 is indexed. Downward movement of rake $110^2$ also lowers the tines $112^2$ to the point at which turret 28 can be advanced without the danger of engaging tines $112^2$ with the pins 18 of a second pin grid array 16.

Figure 8A:
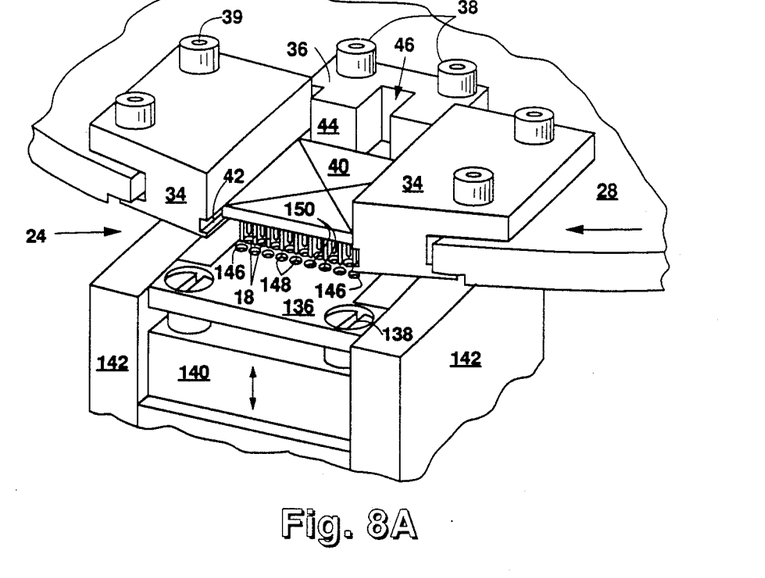
FIGS. 8A and 8B are enlarged, perspective views of the apparatus of FIG. 1 showing the station at which fine straightening of the pins of a pin grid array occurs.
Figure 8B:
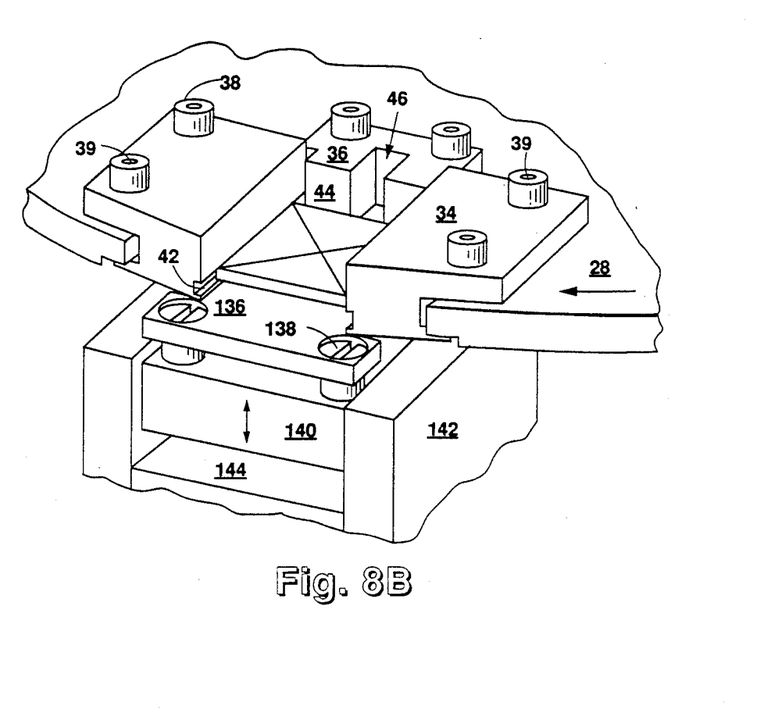
Figure 9A:
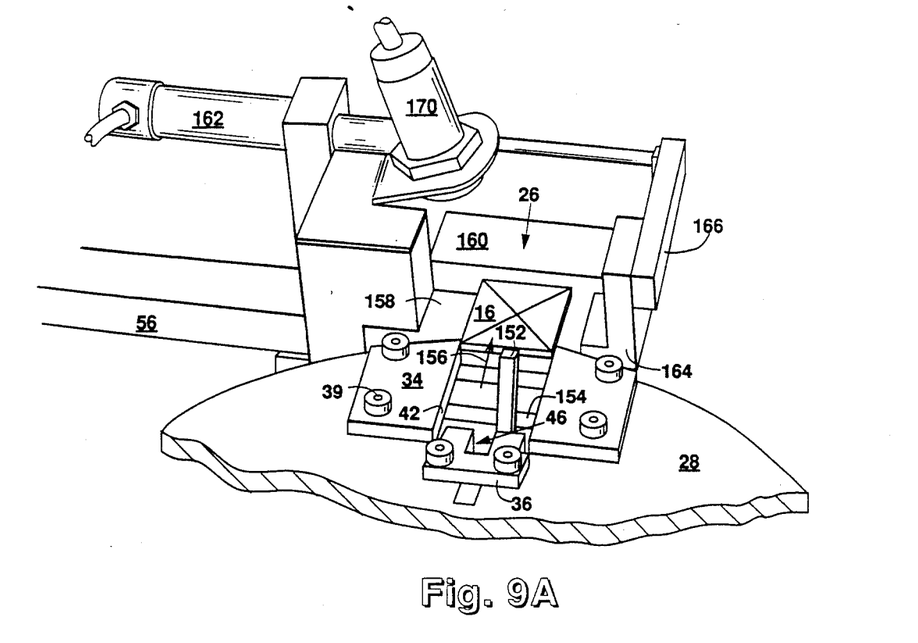
FIGS. 9A and 9B are enlarged, perspective views of the apparatus of FIG. 1 showing a pin grid array having straightened pins being unloaded from the apparatus into a shipping tube.
Figure 9B:
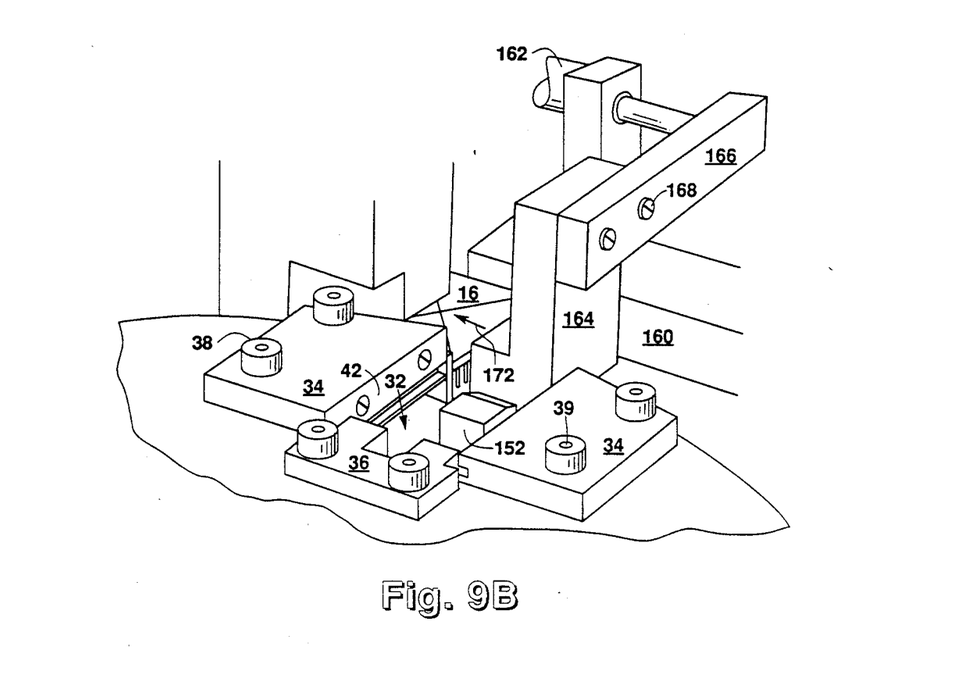

Referring now to FIGS. 8A and 8B, there is shown a means having a plurality of holes therein for receiving the pins of a combed pin grid array when the pin grid array is positioned at another of the stations and the pin receiving means is moved toward the wafer of the pin grid array, thereby providing fine straightening of the pins, at reference numeral 24. The pin receiving means 24 preferably takes the form of a jig 136 mounted by screws 138 to a slide 140 which moves up and down within guides 142 under the influence of a pneumatic cylinder 144. Jig 136 is mounted to table 30 at a position which is at one of the ninety degree reference points, preferably three fourths of a revolution of turret 28, such that once a pin grid array 16 has indexed six times, the pin grid array 16 is positioned at the station at which pin receiving means 24 is located for fine straightening of pins 18. That fine straightening is provided by the holes 146 in jig 136, each of which is provided with a funnel-shaped profile, e.g., a wider portion 148 at the opening of each hole 146 and a narrow, deeper portion 150 for receiving the pin 18 of pin grid array 16 when jig 136 is moved toward the wafer 40 thereof. As noted above, one of the advantages of the apparatus 10 of the present invention is the ability to quickly and conveniently straighten the pins 18 of pin grid arrays 16 of different sizes, different length pins 18, different diameters, and/or different numbers or positions of the pins 18 on wafer 40. To accomplish that flexibility, the jig 136 is conveniently replaced with jigs (not shown) having the appropriate number, pattern and/or depth of holes 146 for receiving the pins 18 on those different pin grid arrays 16 by unscrewing screws 138.

At the fourth station, which is preferably positioned at one of the 45 degree reference points and reached by a pin grid array 16 which has been indexed seven times by rotation of turret 28, means is provided for unloading that pin grid array 16, having the now-straightened pins 18 extending therefrom, from turret 28. Unloading means 26 preferably takes the form of a kicker 152 mounted to an axle (not shown) journaled in a pedestal (not shown) mounted on table 30 under turret 28 and having the ram of a selectively activatable pneumatic cylinder (not shown) pivotally mounted thereto above the axle to cause kicker 152 to engage the wafer 40 of a pin grid array 16 positioned at this fourth station to eject pin grid array from turret 28 in the direction of arrow 156 (see FIG. 9A). Due to the position of the pneumatic cylinder which operates kicker 152 and the need for clarity in the figures, only the kicker 152 of unloading means 26 is shown in the figures. However, the structure of kicker 152 and the activating cylinder is the same as that of the kicker arm 90 of loading means 14. As noted above, back die 36 is provided with a recess 46, and recess 46 provides sufficient clearance for kicker 152 to pivot from up under turret 28 to engage pin grid array 16.

Pin grid array 16 is unloaded onto a platform 158, the surface of which is flush with the bottom surface of a second shipping tube 56. Platform 158, like the dies 34 and 36 and several other components described above, is interchangeable by means of screws (not shown) for use with pin grid arrays having pins of different lengths so that the surface of platform 158 will be flush with second shipping tube 56 and so that vertical and horizontal dimensions can all be adjusted to allow the pin grid array 16 positioned thereon be slide smoothly into second tube 56 as will be described. The radially outward movement of pin grid array 16 in the direction of arrow 156 onto the platform 158 is limited by a fence 160, the edge of which is also flush with the edge of second tube 56. Once pin grid array 16 is positioned on platform 158 against fence 160, double-acting pneumatic cylinder 162 is activated, causing the pusher 164 mounted to the bracket 166 by screws 168 to engage pin grid array 16 to push the pin grid array 16 towards second tube 56, e.g., in the direction of arrow 172 (see FIG. 9B). Pusher 164 is removed from bracket 166 by unscrewing screws 168 so that a pusher 164 of different dimensions (not shown) can be mounted thereto to push a pin grid array of different dimensions into second tube 56. An infrared proximity sensor 170 is positioned so as to have the beam thereof interrupted by the pin grid array 16 being pushed in the direction of arrow 172 and is connected to an electrically-activated incremental counter 174 (see FIGS. 1, 2 and 10). As the pins of additional pin grid arrays 16 are straightened and unloaded from turret 28, the first pin grid array 16 is pushed progressively further into second tube 56 (see FIG. 1).

Figure 2:
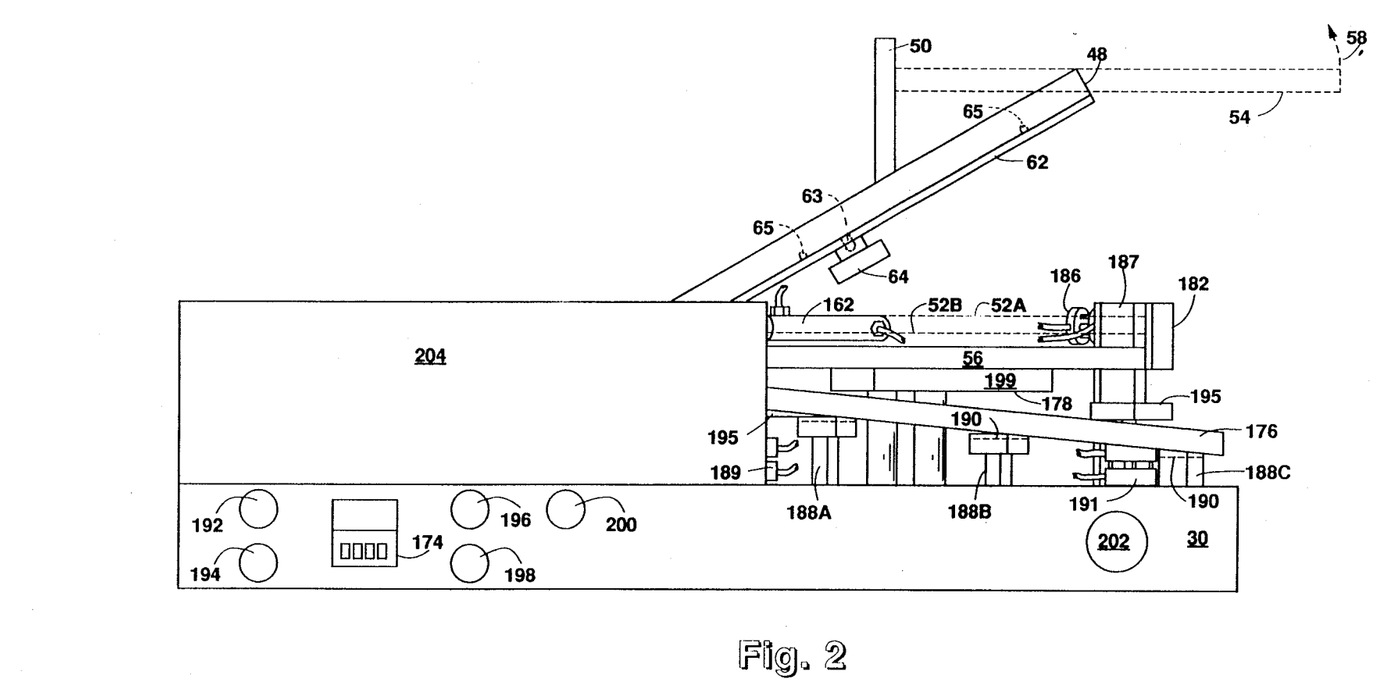
FIG. 2 is a front elevational view of the apparatus of FIG. 1.

Means is also provided for switching from one tube 56 to another such tube. Referring, for instance, to FIGS. 1 and 2, it can be seen that a tube 176 has already been filled with pin grid arrays 16 having straightened pins 18 and switched out for a tube 56 which is in the process of being filled. A plurality of empty tubes or containers, shown at reference numerals 52A and 52B, is stacked on top of second tube 56 on platform 178. The stack of tubes 52A, 52B and 56 is held in place by the guides 180 and 182 at opposite ends of tubes 52A, 52B, and 56, and is aligned by action of pneumatic cylinders 184 and 186. The rams (not numbered) of pneumatic cylinders 184 and 186 are provided with blocks 185 and 187, respectively, which bear against the sides of the tubes 52A, 52B and 56 to insure not only retention of the tubes 52A, 52B and 56 on top of each other, but also alignment of tube 56 with the fence 160 against which a pin grid array 16, having straightened pins 18 extending therefrom, is pushed by kicker 152 for receipt of the pin grid array 16 when pushed by pusher 164 into the tube 56 (see also FIGS. 9A and 9B)

Once second tube 56 has been filled with a specified number of pin grid arrays as counted by proximity sensor 170 and counter 124, the pneumatic cylinders 184 and 186 are activated to retract blocks 185 and 187 bearing against second tube 56 and pneumatic cylinders 189 and 191 are activated so that the plates 193 and 195 mounted thereto rise to the level of platform 178, picking the stack of tubes 52A, 52B and 56 up off of platform 178. Pneumatic cylinder 197 is then activated to retract platform 178 and pneumatic cylinders 189 and 191 reversed to lower the stack of tubes 52A, 52B and 56 the retraction of platform 178 providing sufficient clearance for tube 56 to be lowered to a plane approximately level with platform 178 and below the bottom margins of block 185 and guide 182. The pneumatic cylinder 197 is then reversed to extend platform 178, causing the leading edge 199 of platform 178 to engage the side of tube 56, pushing tube 56 off of the plates 193 and 195 onto pedestals 188A, B and C. Extension of platform 178, coupled with continued downward movement of the plates 193 and 195 as pneumatic cylinders 189 and 191 complete their stroke, results in the support of tubes 52A and 52B on platform 178, the block 185 and guide 182 preventing lateral movement of tubes 52A and 52B as tube 56 is pushed by the leading edge 149 of platform 178. Pneumatic cylinders 184 and 186 are then reversed to effectively clamp the tube 52A back into alignment between guides 180 and 182 and blocks 185 and 187. Pedestals 188 are provided with padding 190 to cushion the fall of a tube such as the tube 56 from platform 178. It will be understood by those skilled in the art who have the benefit of this disclosure that tube 56 could be ejected onto a conveyor belt for transport to another location for shipping or final assembly of the pin grid arrays 16, or that tube 56 could be a rack or trough for routing the pin grid arrays 16 to a device for final assembly such that the tube switching means is note used.

Controls are Provided on the edge of table 30 for power on 192, start 194, stop 196, indexing 198, tube ejection 200, and power off 202. A cover 204 (shown in FIG. 2 only) is provided for protecting the turret 28 and other moving parts of apparatus 10 while allowing access to the tubes 56 and 176 as well as preventing clothing, hair, fingers or debris from interfering with operation of the apparatus 10 or injury.

Figure 10:
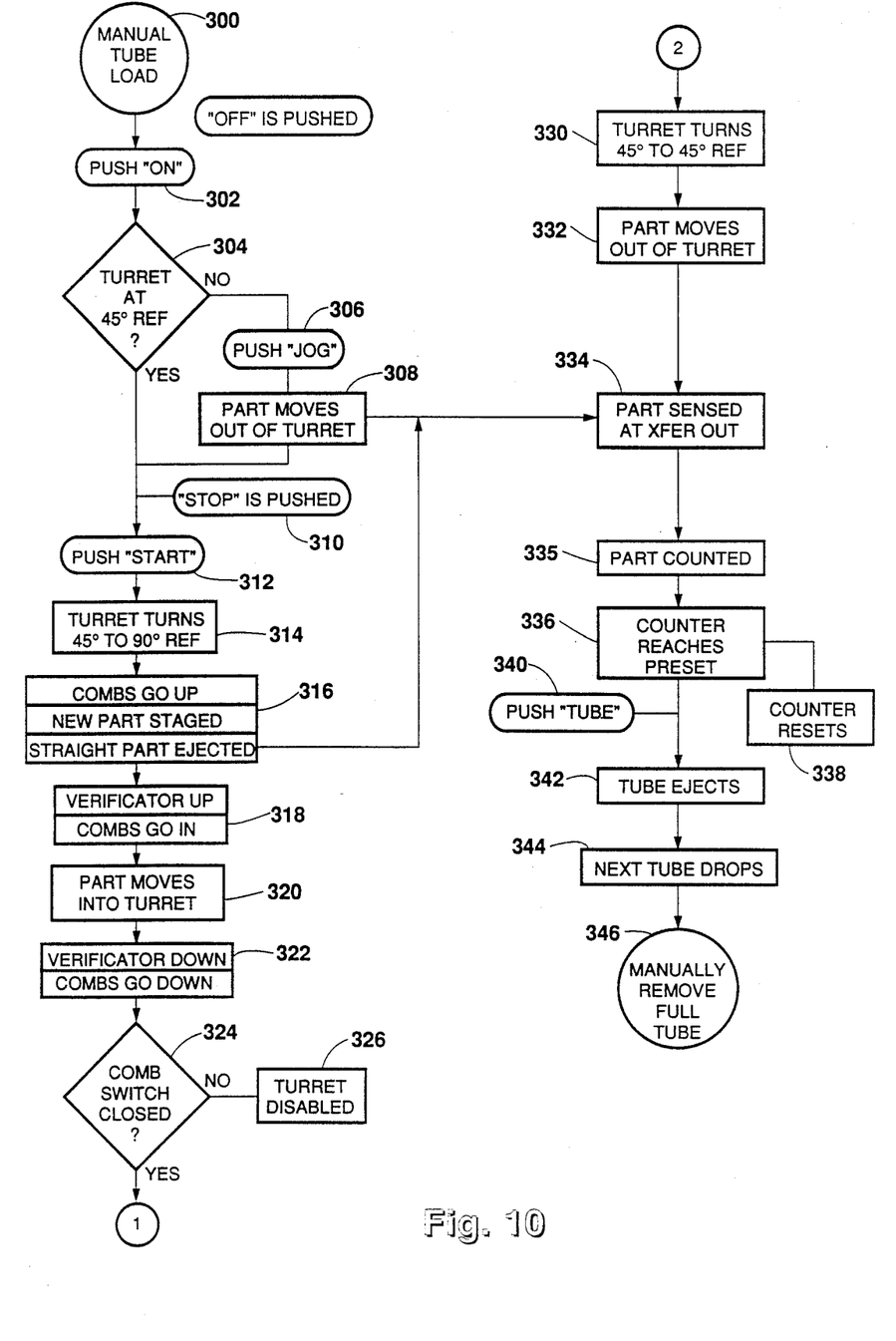
FIG. 10 is a schematic diagram of the air control logic used for controlling the operation of the apparatus of FIG. 1.

Referring now to FIG. 10, the method of the present invention will be described with particular reference to the air control logic. The method commences with the manual loading of first tube 54 containing a pin grid array 16 into the chute 48 as noted at reference numeral 300, and pushing the power on switch 192, as noted at step 302. As described above, manual loading of tube 54 is not required as pin grid arrays 16 can also be loaded from a passing conveyor. A check is made at step 304 to determine whether turret 28 is positioned at one of the 45 degree reference points provided by first combing station 20, second combing station 22, fine straightening station 24, or unloading station 26 as described above, and if not, the index switch 198 is pushed at step 306, causing turret 28 to advance and any pin grid array 16 which may or may not be present in unloading means 26 (referred to as a "part" in FIG. 10) to be ejected from turret 28 by activation of kicker 152. Returning to step 304, if turret 28 is at one of the forty-five degree reference points and/or once steps 306 and 308 have been accomplished, a check is made to determine whether the stop switch 196 has been pushed at step 310, and if so, the start switch 194 must be engaged at step 312 to cause turret 28 to advance to either a forty-five or ninety degree reference point at step 314. Once turret 28 has stopped, and depending upon the particular station at which a pin grid array 16 is positioned, straightening operations are commenced at step 316. Pneumatic cylinders 130 and $130^2$ are activated to raise rakes 110 and $110^2$, pneumatic cylinder 76 is activated to stage a pin grid array 16, and the kicker 152 ejects a pin grid array 16 having straightened pins 18 extending therefrom from turret 28. A check is then made at step 318, labelled "verificator up" in FIG. 10, to verify that the rakes 110 and $110^2$ are in the raised position and, if so, pneumatic cylinders 120 and $120^2$ are activated to insert the tines 112 and $112^2$ between the rows and columns of pins 18. A staged pin grid array 16 is then positioned in turret 28 by activation of the pneumatic cylinder which causes kicker arm 90 to engage the pin grid array 16, loading the staged pin grid array 16 into turret 28 at step 320. A check is then made at step 322, labelled "verificator down," to verify that the rakes 110 and $110^2$ can be lowered to comb the pins 18, and if so, pneumatic cylinders 130 and $130^2$ are activated to do so, closing a comb switch (not shown) to complete the series of operations. A check is made at step 324 to determine whether the comb switch is closed and if not, turret 28 is disabled at step 326 to prevent the rotation of turret 28 and possible damage to the apparatus 10 or pin grid array 16.

Returning to step 324, if the comb switch is open, then turret 28 advances to a forty-five degree reference point as per instruction 330 and a pin grid array 16 having straightened pins 18 positioned in unloading means 26 is ejected from turret 28 at step 332. The unloaded pin grid array 16 is sensed at transfer out (captioned "XFER OUT" in FIG. 10), or unloading, by proximity sensor 170 at step 334, the counter 174 increments at step 335 until a preset number of parts, as per instruction 336, is counted, and counter 174 then resets at step 338. Returning to instruction 336, a check is made to determine whether the tube eject switch 200 has been activated to eject second tube 56 as per instruction 342 causing another tube, such as tube 52A, to be supported onto platform 178 at step 344. The method ends with the manual removal of the second tube 56 at step 346.

Although the invention has been described in terms of the above-described presently preferred embodiment, it will be recognized by those skilled in the art who have the benefit of this disclosure that many changes and alterations could be made to the apparatus without changing its intended purpose and function. All such changes and modifications are intended to fall within the spirit and scope of the following claims.

What is claimed is:

1. An apparatus for straightening the pins of a pin grid array comprising:
   means for positioning a pin grid array having a plurality of nominally parallel pins extending from the wafer thereof at a plurality of stations for performing pin straightening operations;
   means for loading the pin grid array into said positioning means;
   means for combing the pins of the pin grid array, said combing means comprising at least one plurality of parallel elongate members for insertion in close proximity to the wafer between the pins of the pin grid array;
   said combing means comprising means for inserting the elongate members in close proximity to the wafer between the pins in first and second directions with respect to the pin grid array while the pin grid array is positioned in at least one of the stations by said positioning means and, once inserted between the pins, moving the elongate members outwardly away from the wafer of the pin grid array to comb the pins thereof;

means for fine straightening the pins of a combed pin grid array when the combed pin grid array is positioned by said positioning means at another of the stations, said fine straightening means including a member having a plurality of holes for receiving the pins of the combed pin grid array and means for moving said pin receiving member toward and away from the wafer of the combed pin grid array, each of said holes having a funnel-shaped profile for fine straightening of a pin received therein; and means for unloading a pin grid array having straightened pins extending therefrom from said positioning means.

2. The apparatus of claim 1 wherein said loading means comprises a chute containing a pin grid array therein positioned at an angle with respect to the horizontal for causing the pin grid array to slide out of said loading means into said positioning means under the influence of gravity.

3. The apparatus of claim 2 wherein said chute is provided with means for retarding the descent of the pin grid array down said chute to prevent damage to the wafer thereof.

4. The apparatus of claim 2 wherein said loading means comprises a pivoting transfer head for receiving a pin grid array from said chute at an angle with respect to the horizontal and staging the pin grid array for receipt by said positioning means.

5. The apparatus of claim 4 wherein said transfer head is provided with means for ejecting a staged pin grid array into said positioning means.

6. The apparatus of claim 1 wherein said positioning means comprises a rotating turret having a jig formed therein for receiving a pin grid array from said loading means.

7. The apparatus of claim 1 wherein the elongate members of said combing means comprise a plurality of tines extending from a rake.

8. The apparatus of claim 7 wherein the inserting and moving means of said combing means is adapted to insert the tines of said rake between rows of the pins of the pin grid array in close proximity and in a first direction parallel to the wafer of the pin grid array and, once the tines have been so inserted, move the rake downwardly away from the wafer of the pin grid array in a second direction perpendicular to the first direction.

9. The apparatus of claim 1 wherein said pin receiving member comprises a jig having a plate with said plurality of funnel-shaped holes formed therein.

10. The apparatus of claim 9 wherein said means for moving said pin receiving member comprises means for raising said jig into close proximity with the wafer of the combed pin grid array.

11. The apparatus of claim 1 wherein said unloading means comprises a kicker arm for contacting the pin grid array to eject the pin grid array from said positioning means.

12. The apparatus of claim 11 wherein said unloading means additionally comprises means for pushing the ejected pin grid array into a container.

13. The apparatus of claim 12 additionally comprising means for replacing the container with another container.

14. The apparatus of claim 1 further comprising control means for indexing a pin grid array received within said positioning means subsequent to the loading, combing, fine straightening and unloading operations.

15. A method of straightening the pins of a pin grid array comprising the steps of:
positioning a pin grid array having a plurality of nominally parallel pins extending therefrom at a plurality of stations for performing a series of operations thereon;
inserting the tines of a first rake, positioned at a first station between the rows of pins, in close proximity to the wafer and combing with the first rake outwardly away from the wafer of the pin grid array to straighten the pins in a first direction with respect to the pin grid array;
inserting the tines of a second rake, positioned at a second station between the columns of pins, and combing with the second rake away from the wafer of the pin grid array to straighten the pins in a second direction substantially at a right angle to the first direction with respect to the pin grid array; and
moving a fine straightening means positioned at a third station and having a plurality of holes therein toward and away from the wafer of the pin grid array, each of the holes having a funnel-shaped profile for fine straightening of a pin received therein.

16. The method of claim 15 wherein the pin grid array is positioned by loading the pin grid array into a rotating turret and rotating the turret to index the pin grid array to each station.

17. The method of claim 16 additionally comprising the step of unloading the pin grid array having straightened pins from the turret.

18. An apparatus for straightening the pins of a pin grid array comprising:
a rotating turret for positioning a pin grid array having a plurality of nominally parallel pins extending from the wafer thereof at a plurality of stations for performing a series of straightening operations to the pins at each station;
means for loading a pin grid array into said rotating turret;
means including a first rake and a second rake respectively positioned at a first and a second of said stations, each of said rakes having a plurality of tines extending therefrom for insertion in close proximity to the wafer between the pins of a pin grid array in said rotating turret in first and second directions with respect to the pin grid array;
a fine straightening jig means positioned at a third station and having a plurality of holes therein for receiving the pins of a pin grid array in said rotating turret and for moving toward the wafer of the pin grid array to straighten the pins;
means for unloading the pin grid array having straightened pins extending from the wafer thereof from said rotating turret; and
control means for indexing the pin grid array in said turret from one of said stations to another, inserting the tines of said first and second rakes in close proximity to the wafer between the pins of the pin grid array and moving said first and second rakes away from the wafer of the pin grid array to comb the pins thereof, raising and lowering said jig, and activating said loading and unloading means.

19. The apparatus in claim 18 wherein said loading means is adapted for receiving a pin grid array from a first shipping tube and said unloading means is adapted for unloading the pin grid array having straightened pins extending from the wafer thereof into a second shipping tube.

20. An apparatus for use in straightening the pins of a pin grid array comprising:
   a rake; and
   a plurality of tines mounted to said rake in an arrangement selected so as to allow said tines to be inserted between the nominally parallel pins of a pin grid array in close proximity to the wafer thereof;
   each said tine having an end a top, a bottom, and first and second convex side surfaces between the top and bottom; the end of each said tine being pointed; and the top of each said tine being broader than the bottom thereof for facilitating the passage of said tine between the pins in close proximity to the wafer with the top of each tine facing the wafer and then downwardly through the pins in a direction away from the wafer.

21. The apparatus of claim 20 wherein the first and second convex side surfaces of each said tine join to form a keel for gradually straightening the pins during the movement of the tines downwardly through the pins in the direction away from the wafer.

* * * * *